Aug. 18, 1959 A. H. FREDRICK ET AL 2,900,455

Q-GATED AMPLIFIER

Filed May 27, 1955

INVENTOR.
ARDEN H. FREDRICK
LEONARD T. WINSHIP

BY

H. A. Mackey

ATTORNEY

United States Patent Office 2,900,455

Patented Aug. 18, 1959

2,900,455

Q-GATED AMPLIFIER

Arden H. Fredrick, Mount Kisco, and Leonard T. Winship, Roslyn Heights, N.Y., assignors to General Precision Laboratory Incorporated, a corporation of New York Application May 27, 1955, Serial No. 511,635

1 Claim. (Cl. 179—171)

Figure 1:
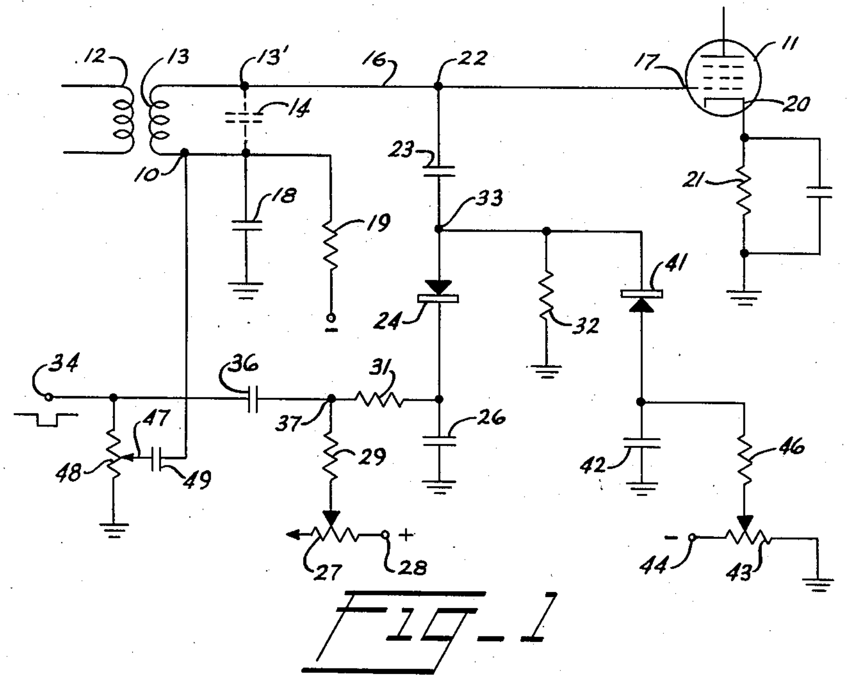

This invention relates to electronic amplifiers which are designed to be disabled for a selected short period of time.

It is frequently desirable to be able to disable an electronic amplifier for a period of time measured in microseconds or in fractions of a microsecond, and that the amplifier be turned on and off rapidly. For example, in the case of pulse radar the radio receiver must be protected from injury or paralysis by the transmitting pulse, but the protection must be removed when the transmitting pulse ends so that the receiver will be in condition for immediate reception of radar echo signals. The conventional method of protection of the receiver includes the application of a negative biasing voltage to the control grid of the input stage of the amplifier, and perhaps also to grids of several following stages. These stages are thus biased below cutoff, and so are disabled. However, at the end of the disabling pulse the receiver cannot immediately return to its operative condition because the several capacitances or inductances involved require time to change their potentials or currents. Even when the time constants of these circuits are very small, a small time delay still exists.

Another cause of delay in some circuits is the shock excitation of resonant circuits by the sharp trailing edge of the disabling pulse. These resonant circuits may then oscillate or "ring" for several microseconds after the termination of the disabling pulse, preventing effective operation of the receiver by masking the signal.

The present invention solves this problem by causing the disabling pulse to shunt the amplifier stage input terminal with a low impedance, so that any signal energy reaching the terminal during the pulse is reduced to a small amount. This result is effected with neutralization of any accompanying potential change at the stage input terminal, so that no time delay at all is chargeable to the existence of finite reactance-resistance time constants. By this method it has been found that the hiatus between the end of the disabling pulse and the restoration of the receiver to service can be reduced to a small fraction of a microsecond.

Looked at it another way, the application of a low-resistance shunt greatly reduces the "Q" of associated resonant circuits so that ringing cannot occur, thus giving rise to the term "Q-gating".

This invention is applicable not only to the input portion of an electronic amplifier employing tubes, but also to transistor amplifiers, amplifiers of any other type and in fact to any devices with the capability of receiving very small signals and having a circuit capable of ringing associated with the input.

One purpose of this invention is to disable a radio receiver for a definite period of time and at the termination thereof to restore the receiver to operative condition with minimum delay.

Another purpose is to gate a radio receiver by reducing its Q.

Still another purpose is to apply a voltage gate to a signal transfer circuit which effectively applies a low impedance across the signal input terminal while not materially changing the bias voltage condition thereat.

A further understanding of this invention may be secured from the detailed description and drawings, in which:

Figure 1 is a schematic circuit drawing of an embodiment of the invention.

Figure 2:
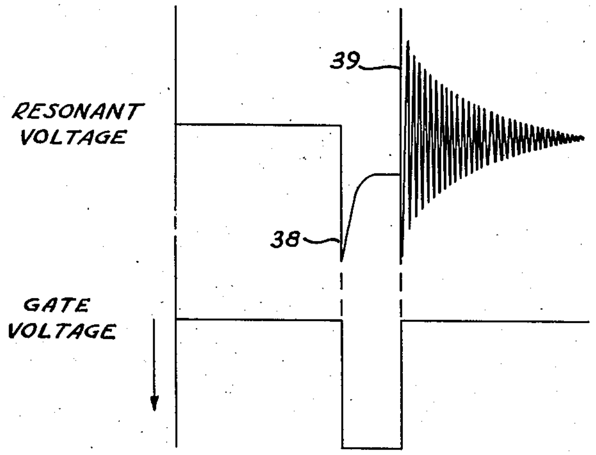

Figure 2 presents graphs illustrating the operation of a portion of the circuit.

Referring now to Fig. 1, a pentode 11 comprises the first stage of amplification of an intermediate frequency amplifier of the type employed in microwave pulse radar receivers. The input signal is conventionally applied through an input transformer having a primary winding 12 and secondary winding 13. The distributed capacitance of the secondary winding 13 and of associated wiring is indicated by the dotted capacitor 14, and dimensions and magnitudes are so designed that the secondary winding 13 and capacitance 14 resonate at the intermediate frequency. The effective impedance of winding 13 over the band of frequencies of interest is at least several thousand ohms, for example, 5000 ohms, even when shunted to increase bandwidth as it conventionally may be. The upper end of coil 13 is connected through conductor 16 to the control grid 17 of pentode 11. The lower end of coil 13 is grounded for operating frequencies and higher frequencies through capacitor 18, and a resistor 19 applies a negative bias to grid 17. Cathode 20 is returned to ground through shunted resistor 21, completing the input grid circuit.

The upper end of coil 13 and grid 17, both points being represented by terminal 22, are connected to ground through a large capacitance 23, a diode 24, and a second large capacitance 26. Diode 24 is of the crystal type and is normally held in the high-resistance condition by an adjustable positive biasing potential represented by voltage divider 27 and positive potential terminal 28. The potential is applied to the negative side of the diode through decoupling resistor 29 and a small resistor 31 employed to damp out high frequency oscillations. A high resistance 32 may be connected between the common terminal 33 of diode 24 and capacitor 23 and ground or, as will be seen in the description of the complete circuit, it may be dispensed with. A gating pulse source represented by terminal 34 applies a short negative pulse through coupling capacitor 36 to the junction 37 of resistors 29 and 31.

The circuit so far described applies a Q gating and disabling pulse to the amplifier stage comprising pentode 11 and transformer secondary winding 13. Let it be assumed that a one-microsecond rectangular pulse representing leakage from a radar transmitting pulse is applied through primary winding 12 to secondary winding 13 and control grid 17. During this pulse the receiver is to be inhibited but is to be activated immediately thereafter, without hiatus if possible, in order to receive the echo signals which immediately follow the transmitting pulse and which also are received through winding 12.

The gating pulse is slightly longer than the transmitting pulse, say 1.1 microsecond long, is centered in time on the transmitting pulse, and therefore starts before the transmitting pulse and ends after it. This gating pulse applied to the negative side of diode 24 overrides the bias derived from the voltage divider 27 and causes the diode to become conductive, with a resistance of the order of 12 ohms. Grid 17 is therefore shunted to ground through a resistance but little greater than 12 ohms, the two capacitors being of the order of 700 $\mu\mu$f., and therefore having low reactance for the intermediate frequency currents. Since this low-resistance shunt is several hundred times less than the impedance of coil 13 and of grid 17, the signal applied through coil 13 is attenuated some 50 d.b. at grid 17. Looked at as Q-gating, the 12-ohm shunt is effectively placed across coil 13, reducing its efficiency and making its operation nonoscillatory.

The negative pulse also tends to disable tube 11 by increasing the negative potential of its control grid 17 during the pulse.

The action as so far described is, however, not entirely satisfactory because the negative potential gate applied to junction 33 is also effective at coil terminal 13′, causing current flow during the pulse through coil 13 to its effectively grounded end 10. During the pulse this pulse current through the coil is not harmful, but because both the front and the rear edges of the pulse are abrupt, they tend to set the coil 13 together with distributed capacitance 14 into oscillation by shock excitation. These oscillations appear as "spikes" of voltage at grid 17, as indicated in Fig. 2. The first spike 38 does no harm because it occurs during the gate, but the second spike 39 persists after termination of the gate, is oscillatory at the intermediate frequency, and robs the circuit of any marked advantage over the conventional negative bias circuit.

In order to eliminate this trailing spike and resulting oscillations 39 the gate pulse current through the secondary coil 13 is reduced by reducing the negative potential at terminal 13′ during the pulse. To accomplish this a second diode 41 is connected in series with a capacitor 42 between junction 33 and ground. This diode is kept normally nonconductive by an adjustable negative potential represented by potentiometer 43 and terminal 44 connected through resistor 46 to the positive side of the diode, the negative side of the diode being connected to junction 33. The path of the negative gate pulse current is now from terminal 34 through capacitor 36, resistor 31, diode 24, junction 33, diode 41 and capacitor 42 to ground. In order to make the negative gate pulse transverse this path with the proper amplitude and to compensate for differences in diodes it is necessary to adjust the pulse resistances of the diodes, which is done in effect by adjusting their bias voltages. This addition of diode 41 provides a pulse path which does not include coil 13 and makes the negative potential of junction 33 and of the terminal 13′ of coil 13 during the pulse much less than it was, so that the current which tends to flow through coil 13 is greatly reduced. In addition, the resistance of the path shunting grid 17 to ground is halved by the addition of the path through capacitor 42.

The remaining tendency of current to flow in coil 13 is eliminated by connecting an intermediate point 47 of resistor 48 through capacitor 49 to the lower end 10 of coil 13. The tap 47 is so chosen that the pulse potential thus applied to terminal 10 exactly equals that applied to the upper end 13′. Thus, since equal voltages exist on the two ends of the coil, no pulse current can flow through it, no spikes are generated and resonant oscillations cannot be set up.

It is possible to prevent any change in potential of junction 33 during the pulse by applying equal negative and positive pulses to diodes 24 and 41. This would eliminate all pulse current flow through coil 13 but would also eliminate all disabling effect on tube 11, so that sufficient isolation of the amplifier from the transmitting pulse leakage might not be secured.

The diodes 24 and 41 are preferably silicon but may be germanium or of any other type including the electronic hot and cold cathode tube types.

What is claimed is:

An amplifier of the class described comprising, a discharge tube having at least cathode and control electrodes, a resonant input circuit coupled between said cathode and control electrodes, a first diode having its anode capacitatively connected to said control electrode and its cathode coupled to said cathode, a second diode having its cathode connected to the anode of said first diode and its anode coupled to the cathode of said discharge tube, bias means rendering said first diode normally nonconductive, bias means for rendering said second diode normally nonconductive, means for applying a negative gating pulse to the cathode of said first diode to override both said bias means and causing both said diodes to conduct thereby providing a low impedance path across said resonant input while applying negative potential to said control electrode and means for applying a potential proportional to the amplitude of said gating pulse to said resonant circuit to prevent shock excitation thereof.

References Cited in the file of this patent

UNITED STATES PATENTS

| | | |
|---|---|---|
| 2,157,312 | Wright | May 9, 1939 |
| 2,459,798 | Dettman | Jan. 25, 1949 |
| 2,466,959 | Moore | Apr. 12, 1949 |
| 2,535,303 | Lewis | Dec. 26, 1950 |
| 2,683,803 | Keizer | July 13, 1954 |

FOREIGN PATENTS

| | | |
|---|---|---|
| 140,406 | Australia | Mar. 7, 1951 |